(12) United States Patent
Abdo et al.

(10) Patent No.: US 7,165,712 B2
(45) Date of Patent: Jan. 23, 2007

(54) TRANSIENT LIQUID PHASE BONDING TO COLD-WORKED SURFACES

(75) Inventors: Zafir Abdo, Orlando, FL (US); Patricia Bezerra, Orlando, FL (US); Paul J. Zombo, Cocoa, FL (US)

(73) Assignee: Siemens Power Generation, Inc., Orlando, FL (US)

( * ) Notice: Subject to any disclaimer, the term of this patent is extended or adjusted under 35 U.S.C. 154(b) by 242 days.

(21) Appl. No.: 10/692,403

(22) Filed: Oct. 23, 2003

(65) Prior Publication Data

US 2005/0087584 A1 Apr. 28, 2005

(51) Int. Cl.
*B23K 1/20* (2006.01)

(52) U.S. Cl. ............... 228/173.1; 228/193; 228/194; 228/195; 148/522

(58) Field of Classification Search ............ 228/173.1, 228/193, 194, 195; 222/195
See application file for complete search history.

(56) References Cited

U.S. PATENT DOCUMENTS

| | | | |
|---|---|---|---|
| 3,678,570 A * | 7/1972 | Paulonis et al. ............ 228/194 |
| 4,005,988 A | 2/1977 | Paulonis et al. |
| 4,208,222 A | 6/1980 | Barlow et al. |
| 4,700,881 A | 10/1987 | Ryan |
| 5,234,152 A | 8/1993 | Glaeser |
| 5,372,298 A | 12/1994 | Glaeser |
| 5,373,983 A * | 12/1994 | Stenard et al. ............ 228/57 |
| 5,415,336 A * | 5/1995 | Stenard et al. ............ 228/193 |
| 5,812,925 A * | 9/1998 | Ecer ............ 428/548 |
| 5,836,075 A | 11/1998 | Fitzgerald et al. |
| 5,853,622 A | 12/1998 | Gallagher et al. |
| 5,922,397 A | 7/1999 | Brandt et al. |
| 5,935,430 A | 8/1999 | Craig |
| 6,087,021 A | 7/2000 | Gaynes et al. |
| 6,193,141 B1 | 2/2001 | Burke et al. |
| 6,199,751 B1 | 3/2001 | Gaynes et al. |
| 6,325,871 B1 * | 12/2001 | Burke et al. ............ 148/522 |
| 6,331,217 B1 * | 12/2001 | Burke et al. ............ 148/522 |
| 6,508,000 B2 | 1/2003 | Burke et al. |
| 2002/0092895 A1 | 7/2002 | Blackshear et al. |
| 2002/0148115 A1 * | 10/2002 | Burke et al. ............ 29/889.1 |
| 2004/0050912 A1 * | 3/2004 | Spencer ............ 228/194 |
| 2005/0072830 A1 * | 4/2005 | Ditzel et al. ............ 228/56.3 |

* cited by examiner

*Primary Examiner*—Jonathan Johnson
*Assistant Examiner*—Rachel E. Beveridge

(57) ABSTRACT

A joint having bond line grains that nucleate in the joint region and grow into the adjoined solid substrates. The resulting bond line grains have a size that is greater than a thickness of a molten region. The surfaces of the substrates are cold worked to a desired degree of residual stress prior to the bonding process so that the recrystallization of the substrate surface necessary for the grains to grow into the substrates results in a reduction in the local free energy.

20 Claims, 2 Drawing Sheets

TRANSIENT LIQUID PHASE BONDING TO COLD-WORKED SURFACES

FIELD OF THE INVENTION

This invention relates generally to the field of metals joining and more particularly to transient liquid phase bonding processes.

BACKGROUND OF THE INVENTION

A process that has been used successfully for repair and material addition to components is known by several different names: diffusion brazing; liquid phase diffusion sintering; and transient liquid phase bonding. These names generally refer to a process wherein a consumable material is melted at a temperature that is less than the solidus temperature of a substrate and then is caused to solidify to become integral with the substrate. (A similar process used to join two components without melting is known as solid-state diffusion bonding.) The consumable material may typically include a melting point depressant such as boron, silicon or phosphorous to ensure that the consumable material will melt at a temperature below the melting temperature of the substrate. The work piece and consumable material are held at an elevated temperature for a sufficient interval of time to promote diffusion of the melting point depressant into the substrate material. This diffusion causes the melting temperature of the liquid to increase, resulting in the solidification of the bond line by epitaxial growth of the grains of the substrate. Prior to the onset of solidification, some local melting of the substrate will occur as the melting point depressant diffuses into the substrate. Exemplary applications of such a process to superalloy materials used in gas turbine components are described in U.S. Pat. Nos. 5,836,075; 6,193,141; and 6,508,000, all of which are incorporated by reference herein.

FIG. 1 illustrates a desirable microstructure for a transient liquid phase joint 10 joining two substrates 12, 14. A consumable insert in the form of a braze foil (not shown) containing a melting point depressant such as boron, silicon or phosphorous was located between the surfaces 12, 14 and was heated to above its liquidus temperature, which is below the solidus temperature of the substrates 12, 14. A molten region 15 is formed having a thickness T as indicated by dashed lines 16, 18. The thickness T is typically equal to the thickness t (not shown) of the consumable insert plus a portion of the thickness of the adjoining substrate surfaces (typically 25% times t) that becomes molten when its liquidus temperature is depressed as the melting point depressant diffuses into the substrate. Upon completion of the bonding heat treatment, the melting point depressant has diffused sufficiently into the substrates 12, 14 so that the grains 20, 22 of the substrate surfaces 16, 18 have grown isothermally and epitaxially to solidify the melted consumable insert. The result is bond 10 having the microstructure, grain size and mechanical properties approximating those of the substrates 12, 14 provided that the mating grains of the two surfaces are favorably oriented. If, however, the grains are somewhat misaligned, a transverse boundary 30 may exist at the bond centerline, thereby degrading the mechanical properties of the joint.

In real world applications, the epitaxial growth of grains from the substrate 12, 14 into the molten material may be retarded or disrupted by the nucleation of grains from within the molten material itself. Grain nucleation within the molten material may result from unmelted consumable insert material, substrate oxide fragments or unclean surfaces. Grain formation from within the molten region may result in a bond joint 24 having the microstructure illustrated in FIG. 2. The non-epitaxial grains 26 are smaller than the substrate grains 20, 22 and they are limited in size to the thickness T of the molten zone. The mechanical properties of such a joint 24 are inferior to those of a joint having the desired epitaxial microstructure.

To achieve epitaxial growth, prior art transient liquid phase bond processes have required the bonding surface to be clean and to exhibit a low amount of residual stress. Low residual stress may be achieved by avoiding the introduction of stress into the surface and/or by conducting a stress-relieving heat treatment prior to the bonding process. Mechanical preparation of the surface that may be necessary for cleaning or for developing a desired surface geometry is conducted with a low stress-generating process. Low stress-generating processes are known to include low stress grinding, electro-chemical machining (ECM) and electro-discharge machining (EDM).

BRIEF DESCRIPTION OF THE DRAWINGS

These and other advantages of the invention will be more apparent from the following description in view of the drawings that show.

DETAILED DESCRIPTION OF THE INVENTION

Figure 3:
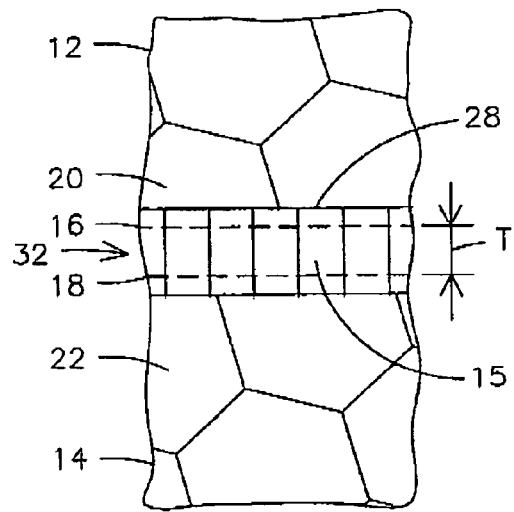
FIG. 3 is a schematic cross-sectional illustration of a transient liquid phase bond joint having large non-epitaxial grains nucleated from within the molten zone and grown into a cold-worked portion of the substrate.

The present inventors innovatively avoid the problem of small bond line grains (limited to the size of the molten region) associated with prior art transient phase bonding processes by purposefully stimulating grain growth from the bond region into the unmelted substrate material 12, 14 to form bond region grains 28 having a size that is in excess of the thickness T of the molten region 15. An example of one such bond 32 is illustrated in FIG. 3. While this example illustrates the bonding of two opposed surfaces, the teachings herein may be applied to the addition of material to a single surface, such as during plating or material build-up processes using a consumable insert. The improved transient liquid phase bond 32 is achieved by imparting energy into the substrate material 12, 14 in the form of residual stress of a sufficient magnitude to cause grains 28, nucleating within the molten region 15, to grow into the substrate 12, 14. Crystal grains will grow into the substrate 12, 14 in order to reduce the total free energy of the system if the local energy state of the substrate 12, 14 is sufficiently high. This new process contrasts with prior art processes where a minimal level of residual stress is desired on the substrate surface in order to ensure the epitaxial growth of grains. The present invention takes advantage of nucleation of nonepitaxial grains originating in the molten region and provides conditions wherein those grains 28 can grow to a size (i.e. a length of one side of the crystal) that exceeds the thickness T of the molten region 15. In various embodiments, grains 28 may be greater than thickness T of the molten region 15, or at least twice the thickness of the molten region, or at least three times the thickness of the molten region, or at least four times the thickness of the molten region. Experiments indicate that grains 28 having a size up to five times the thickness T of the molten region 15 can be achieved.

Figure 1:
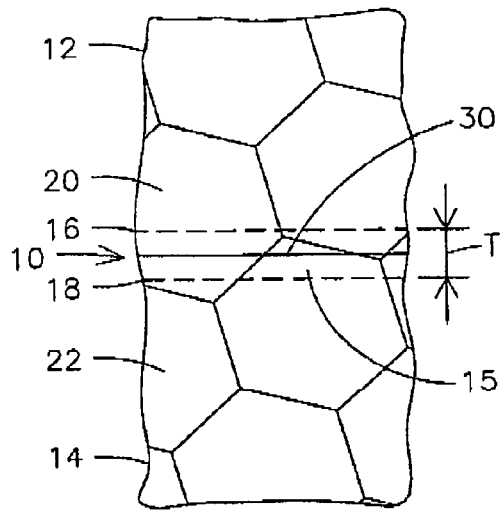
FIG. 1 is a schematic cross-sectional illustration of a prior art transient liquid phase bond joint.
Figure 2:
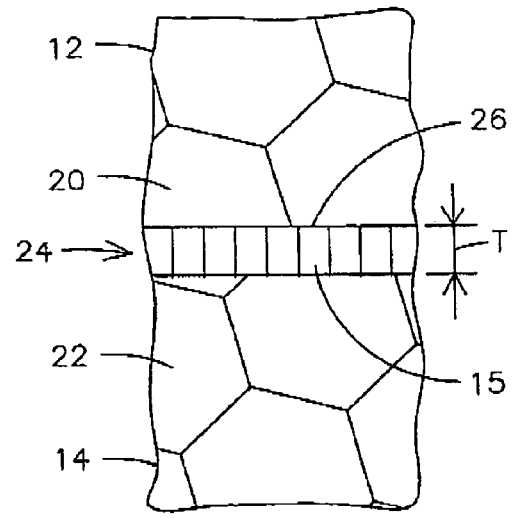
FIG. 2 is a schematic cross-sectional illustration of a prior art transient liquid phase bond joint having small non-epitaxial grains nucleated within and limited to the molten zone T.

With perfect epitaxial growth of substrate grains 20, 22 into the molten region 15, such as is illustrated in FIG. 1, there can exist a plane 30 of transverse grain boundaries at the center of the bond 10, if the mating grains 20, 22 are not favorably oriented. This plane 30 is within the molten region where it is difficult to achieve optimal grain boundary strength due to the lack of grain boundary strengthener elements, carbide precipitates and the presence of residual melting point depressant. The present invention advantageously provides bond line grains 28 that displace the transverse grain boundaries away from the center of the bond joint 32.

The substrate surface may be cold worked in order to achieve a desired heightened local level of free energy prior to a transient liquid phase bonding process. Shot peening, laser peening, burnishing, milling, high stress grinding, sawing, etc can be used to achieve the desired degree of cold working. The amount of free energy introduced into the surface should be sufficiently high to allow grains that have nucleated in the molten region 15 to grow into the substrate, thereby reducing the local free energy. A desired amount of cold working will not interfere with perfect epitaxial growth of substrate grains into the molten region. However, if grains do nucleate in the molten region, the cold working will enable such grains to grow into the substrate.

Figure 4:
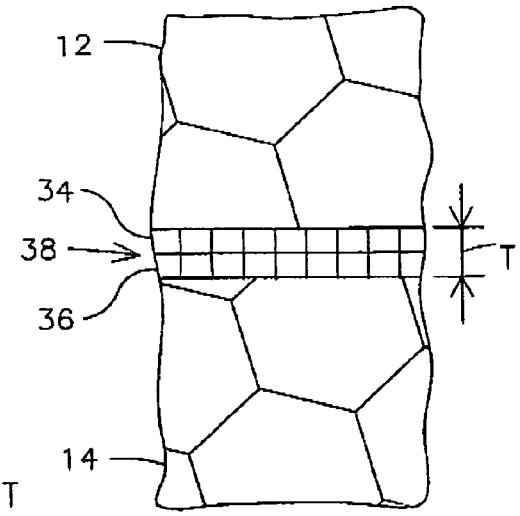
FIG. 4 is a schematic cross-sectional illustration of a prior art transient liquid phase bond joint having two stacked rows of grains.

If an excessive amount of energy is imparted by cold working of the substrate surface, the recrystallization temperature of the substrate material may be reduced to a temperature below the brazing temperature used for the bonding process. This allows grains to nucleate in the substrate surface prior to the onset of melting of the consumable insert. This can result in the condition illustrated in FIG. 4, wherein grains grow from the recrystallized substrates 12, 14 into the molten region, thereby creating two stacked rows of grains 34, 36 within the bond region. While bond 38 of FIG. 4 may be acceptable for certain applications, the strength of the bond 38 will be less than that of the bond 32 of FIG. 3.

The desired degree of cold working necessary to achieve the desired microstructure will depend upon the materials and bonding process used. Experiments conducted by the present inventors using Inconel® alloy IN-738 and Ni-Flex 115 brand brazing ribbon indicate that cold-working of the substrate surface by shot peening to a value of between 8 and 16 on the Almen A scale will provide a joint 32 with the desired bond line grains 28. The best results of this group were obtained with a stress level of about 9 on the Almen A scale. Joints 32 with the desired bond line grains 28 have also been obtained by sawing or milling the substrate surface prior to bonding, although no quantitative measure of the level of cold working induced by such sawing or milling was obtained for these experiments.

A transient liquid phase bonding process may include the steps of heating a consumable insert and a substrate surface together to a temperature above the liquidus temperature of the consumable insert and below the solidus temperature of the substrate to form a molten region. The consumable insert may be an interlayer between two substrate surfaces. The molten region is then held at the bonding temperature to diffuse a melting point depressant from the molten consumable insert into the substrate to solidify a bond. Prior to the heating step, the substrate surface is cold worked to a degree sufficient to cause bond line grains nucleating in the molten region to grow into the substrate. However, the surface is cold worked to a degree less than that which would cause recrystallization of the substrate material at or below the bond temperature of the consumable insert. The resulting bond will include non-epitaxial bond line grains extending into an unmelted portion of the substrate surface, thereby resulting in bond line grains that have a size exceeding the size of the molten region.

Figure 5:
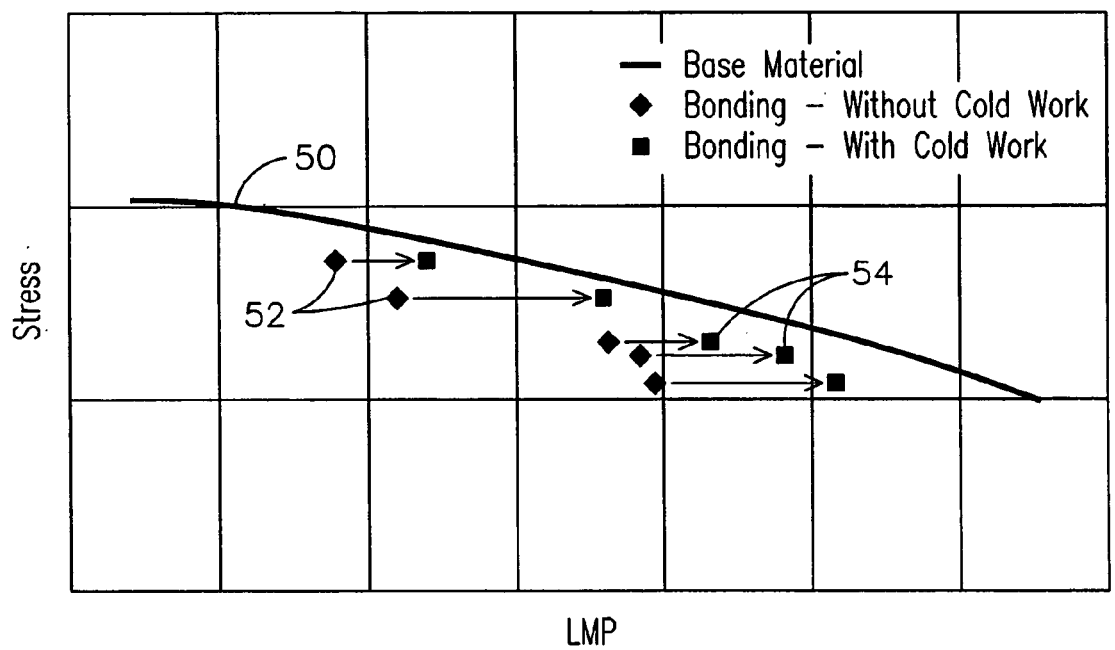
FIG. 5 illustrates a comparison of prior art transient liquid phase bonding to transient liquid phase bonding of cold worked surfaces.

FIG. 5 illustrates improvement that may be achieved in a transient liquid phase bond joint by imparting a degree of cold working to the bonding surfaces prior to forming the bond joint. Curve 50 of FIG. 5 illustrates the relationship between stress and the Larson-Miller Parameter (LMP) relationship for Inconel® alloy IN-738. Data points 52 illustrate the stress-LMP relationship for a transient liquid phase bond joint formed with Ni-Flex 115 brand brazing ribbon using a prior art bonding process. Data points 54 illustrate the stress-LMP relationship for the equivalent joints formed after both of the bond surfaces had been cold worked prior to the bonding process. It should be noted that the same test conditions were applied for both data sets.

Figure 6:
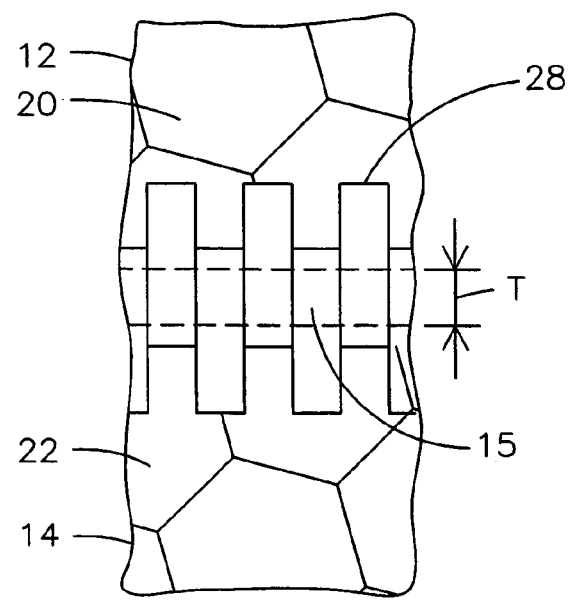
FIG. 6 is a schematic cross-sectional illustration of a transient liquid phase bond joint having large non-epitaxial grains grown from within the molten zone to varying depths into the adjoined substrates.

It is possible to locally engineer a liquid phase bond structure by cold working one or both surfaces prior to bonding. It is possible to impart a different degree of cold working or an uneven pattern of cold working to the opposed surfaces to preferentially affect the grain growth pattern. In one embodiment illustrated in FIG. 6, grains nucleating within the molten insert material have been encouraged to grow to varying depths into the substrate surface by imparting a varying degree of cold working to the surface prior to the bonding process. The staggered pattern of bond line grains prevents the creation of a plane of grain boundaries parallel to the bond centerline. The pattern of bond line grains illustrated in FIG. 6 may be obtained by cross cold-working the two opposed surfaces, i.e. imparting a mirror image pattern of cold working stress into the opposed surfaces, such as by sawing the surfaces in opposite directions or by imposing mirror image patterns of peening onto the surfaces, such as by using mirror image masks during a peening process. Uneven cold working of the surface during shot peening may also be achieved by using large diameter peening media with less than 100% coverage of the surface area. Alternatively, the two opposed surfaces may be cold worked to different levels so that the recrystallization temperature of one substrate is below the bond temperature. During heat up to the bond temperature, the substrate having the higher level of cold working will recrystallize. Then at the bonding temperature, the recrystallized grains will begin to grow through the molten region into the opposite less-heavily cold worked surface.

It is possible to cold work a surface prior to a joining process to induce and store localized energy that will be used in a subsequent joining process applied to the surface. The subsequent joining process may be transient liquid phase bonding, diffusion brazing or diffusion bonding. The bonding process may cause grains to nucleate in the joint region, such as within a melted filler-metal layer or in a diffusion bond interaction zone. Because of the high localized energy state resulting from the cold working, any such grains will tend to grow into the substrate surface in order to reduce the total free energy of the joint.

It is also possible to cold work the region surrounding a joint after the joint has been formed. This may be especially useful for bonds between relatively thin members, such as airfoil skins used for gas turbine blades. It is possible to enlarge the grain size in a bond region even after small grains that are confined to the molten region are formed. After a transient liquid phase bond is created between two mating surfaces, the substrate in the bond region is cold worked to a predetermined degree. During a subsequent heat treatment, the cold worked bond region will attempt to reduce the local energy by nucleating and growing new grains larger than the original grains that were limited in size to the size of the molten zone. For an airfoil skin member, it may be advantageous to impart an adequate amount of cold working so that the recrystallization extends through the full thickness of the airfoil material. This technique may also be used for a welded joint to cause grains nucleating in the weld region to grow into the mating substrate after the weld joint has been formed.

While various embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

The invention claimed is:

1. A materials joining process comprising:
   cold working a surface of a substrate; and
   bonding a consumable insert to the substrate surface with a transient liquid phase bonding process at a bond temperature;
   wherein the substrate surface is cold worked to a degree sufficient to cause grains nucleating in a molten portion of the consumable insert during the transient liquid phase bonding process to grow into the substrate, and to a degree less than that which would cause recrystallization of the substrate at or below the bond temperature, to produce bond line grains having a size exceeding a thickness of the molten portion.

2. The process of claim 1, further comprising:
   cold working respective surfaces of two substrates; and
   bonding the two surfaces together with the consumable insert during the transient liquid phase bonding process.

3. The process of claim 2, further comprising cold working each of the two respective surfaces to a different degree.

4. The process of claim 1, further comprising imparting an uneven pattern of cold working stress into the surface.

5. The process of claim 1, further comprising bonding the cold worked surface to an opposed surface that is not cold worked with the transient liquid phase bonding process.

6. The process of claim 1, further comprising shot peening the surface to within the range of 8–16 on the Almen A scale.

7. The process of claim 1, wherein the substrate surface is cold worked to a degree sufficient to cause grains to grow into the substrate to a size at least twice the thickness of the molten portion.

8. The process of claim 1, wherein the substrate surface is cold worked to a degree sufficient to cause grains to grow into the substrate to a size at least three times the thickness of the molten portion.

9. The process of claim 1, wherein the substrate surface is cold worked to a degree sufficient to cause grains to grow into the substrate to a size at least four times the thickness of the molten portion.

10. A materials joining process comprising:
    applying a joining process to join a substrate to another member to form a joint;
    cold working the substrate proximate the joint after the joint is formed; and
    heat treating the substrate and the joint together to nucleate and grow grains of the joint;
    wherein the substrate is cold worked to a degree sufficient to cause the joint grains to recrystallize and grow into the substrate during the heat treating step.

11. The process of claim 10, wherein the joining process comprises a transient liquid phase bonding process, and wherein the joint grains grow into the substrate to a size greater than a thickness of a molten region existing during the transient liquid phase bonding process.

12. The process of claim 10, wherein the joint comprises a weld region, and wherein grains nucleating in the weld region grow into the substrate after the joint has been formed.

13. The process of claim 10, wherein the substrate is cold worked to a degree sufficient to cause the joint grains to grow through a full thickness of the substrate.

14. A materials joining process comprising:
    cold working a substrate surface;
    applying a second material against the cold worked substrate surface;
    heating the second material and cold worked substrate surface together to a bonding temperature; and
    wherein the substrate surface is cold worked to a degree sufficient to allow grains nucleating in the second material to grow into the substrate surface during the heating step but to a degree less than that which would cause recrystallization of the substrate at or below the bonding temperature.

15. The process of claim 14, wherein the substrate material comprises a first substrate material and the second material comprises a second substrate having a surface.

16. The process of claim 15, further comprising cold working the second substrate surface prior to the steps of applying and heating to allow the grains nucleating in the second material to grow into the second substrate during the step of heating.

17. The process of claim 15, further comprising cold working the second substrate surface prior to the steps of applying and heating to lower a recrystallization temperature of the second substrate surface to below the bonding temperature so that during a heat up to the bonding temperature the second substrate surface will nucleate recrystallized grains and the recrystallized grains will grow into the first substrate during the step of heating.

18. The process of claim 14, wherein the second material comprises a consumable insert that becomes molten during the step of heating.

19. The process of claim 18, further comprising applying the consumable insert between the cold worked substrate surface and a surface of a second substrate during the step of heating to form a bond between the cold worked substrate and the second substrate.

20. The process of claim 19, further comprising cold working the second substrate surface prior to the step of heating so that the grains nucleating in the consumable insert material grow into the second substrate during the step of heating.

* * * * *